United States Patent
Grushin

(10) Patent No.: US 7,124,153 B2
(45) Date of Patent: Oct. 17, 2006

(54) FREQUENCY CONVERTER AND METHODS OF USE THEREOF

(75) Inventor: Stanislav Grushin, San Jose, CA (US)

(73) Assignee: Genesis Microchip Inc., Alviso, CA (US)

(*) Notice: Subject to any disclaimer, the term of this patent is extended or adjusted under 35 U.S.C. 154(b) by 863 days.

(21) Appl. No.: 10/100,803

(22) Filed: Mar. 18, 2002

(65) Prior Publication Data

US 2003/0174797 A1 Sep. 18, 2003

(51) Int. Cl.
*G06F 7/52* (2006.01)
*H03K 21/00* (2006.01)

(52) U.S. Cl. .................. 708/103; 708/271; 377/47

(58) Field of Classification Search ............... 708/103, 708/271
See application file for complete search history.

(56) References Cited

U.S. PATENT DOCUMENTS

| | | | |
|---|---|---|---|
| 3,414,720 A | 12/1968 | Battarel | |
| 5,382,913 A | 1/1995 | Carson et al. | 327/141 |
| 5,422,835 A | 6/1995 | Houle et al. | |
| 5,796,392 A | 8/1998 | Eglit | 345/213 |
| 5,828,250 A | 10/1998 | Konno | |
| 5,933,035 A | 8/1999 | Bezzant et al. | |
| 6,232,952 B1 | 5/2001 | Eglit | 345/134 |
| 6,353,469 B1 * | 3/2002 | Schaub et al. | 355/18 |
| 6,356,123 B1 | 3/2002 | Lee et al. | |
| 2003/0173945 A1 | 9/2003 | Grushin | |

FOREIGN PATENT DOCUMENTS

| | | | |
|---|---|---|---|
| EP | 0522274 A1 | 1/1993 | |
| EP | 0778675 A1 | 6/1997 | |
| EP | 0863612 A2 | 9/1998 | |

OTHER PUBLICATIONS

EPO Office Action dated Jul. 18, 2005 for European Patent Application No. 03716528.9.
International Search Report from PCT Application PCT/US03/08067 mailed Jun. 30, 2003.
European Office Action dated Feb. 14, 2006 from corresponding European Patent Application No. 03716528.9.
"A Digital Frequency Synthesizer with a Phase Accumulator", Hikawa et al., 1988 IEEE International Symposium on Circuits and Systems, Proceedings, vol. 1, p. 373-376.
Copy of International Search Report in Corresponding PCT Application PCT/US03/07707.

\* cited by examiner

*Primary Examiner*—Chuong D. Ngo
(74) *Attorney, Agent, or Firm*—Beyer Weaver & Thomas, LLP

(57) ABSTRACT

An all-digital frequency conversion apparatus is provided that achieves frequency conversion using a simple phase detector and integer and fractional phase feedback information from a digital oscillator output. In an embodiment, a target phase accumulator unit generates a target phase signal to the phase detector unit. The target phase accumulator unit receives inputs from a reference signal input, and a target phase input value. The digital phase detector unit receives the reference signal, a current phase feedback input signal, and the target phase input signal. The phase detector unit outputs a frequency setting signal to a frequency value generator unit. The detector output is based on the difference between the current phase and the target phase. A frequency value generator unit is configured to output a frequency value signal to a digital oscillator unit that generates a corresponding digital output signal that is directly fed back to the current phase feedback input of the phase detector unit. A method, computing system, and software product that implement the present invention are also provided.

24 Claims, 8 Drawing Sheets

FREQUENCY CONVERTER AND METHODS OF USE THEREOF

FIELD OF THE INVENTION

The present invention relates generally to frequency converters. More particularly, the invention relates to a digital frequency converter that precisely adjusts a reference frequency.

BACKGROUND OF THE INVENTION

In many types of electrical systems it is desirable to generate clock signals with various frequency and phase relationships synthesized from certain reference signals. A common way to synthesize derivatives of a reference signal is based upon the analog phase locked loop (PLL) frequency converter. Accordingly, FIG. 1 shows a traditional analog PLL 100 that takes a digital source frequency SCLK as an input to a source divider 104 that divides SCLK by an integer value S to create reference frequency $f_{REF}$. A negative feedback PLL control loop 105 is formed by a phase detector 106, a charge pump 108, a low pass loop filter 110, a voltage controlled oscillator (VCO) 112, and a feedback divider 114. Phase detector 106 performs a phase difference operation on $f_{REF}$ and feedback frequency $f_{BACK}$. That is, phase detector 106 generates a phase error signal $U_{ERR}$ that is zero when $f_{REF}$ and $f_{BACK}$ are equal, and varies inversely with their difference. The feed-forward path 107 of the PLL control loop generates an output, or destination, frequency DCLK from VCO 112 whose output frequency is controlled by $U_{ERR}$ through a voltage created by charge pump 108 and low pass filter 110. Specifically, charge pump 108 converts $U_{ERR}$ to a voltage signal that is smoothed by low pass loop filter 110, thereby providing a control voltage to VCO 112. The feedback path 113 of the PLL control loop feeds frequency output DCLK into feedback divider 114 which creates the $f_{BACK}$ signal by dividing DCLK by an integer value F. The output frequency of DCLK is a multiple or fraction of source frequency SCLK as determined by the ratio F/S.

PLL phase jitter, loop stability and response time are principally determined by the analog charge pump 108 and low pass loop filter 110 components. Capacitive elements in these analog PLL components introduce significant loop time constants and phase jitter that result in loop behavior that is difficult to understand, and predict, especially when the source frequency SCLK rapidly changes. One reason for this uncertainty, for example, is that capacitors are subject to thermal variation of their electrical characteristics. Moreover, practical implementations of analog PLL based frequency converters are often limited to a small compare period (i.e., a small values of F and S) because a large compare period requires a larger capacitor in filter 110, which is impossible in many applications. For at least these reasons, analog PLLs are very difficult to practically use for accurate frequency conversion, especially when the source frequency SCLK is not a constant value. In many types of systems, a digitally controlled generator of DCLK is required, instead of a fixed-frequency analog oscillator, for example. One conventional and important component of the generator is called a discrete-time oscillator (DTO), and is shown by way of example in FIG. 2 as DTO 200. The DTO 200 includes an n-bit adder 202 that adds a n-bit increment value SF (scale factor) to the previous output value of register 204, whereby the output value of register 204 is updated with the newly incremented value upon the next rising edge of a reference clock signal RCLK, thereby generating, over some number of RCLK cycles the n-bit staircase output represented by signal 206 The duration of each step in the staircase output signal 206 is equal to the RCLK period $T_{RCLK}$. After each period of the DTO output signal 206, a carry bit 208 is generated. Carry bit 208 represents the integer part of the DTO output periods, and the staircase DTO output signal 206 contains information about the fractional part of each period. The DTO oscillation period is determined by the MODULO of the DTO adder, the value of SF, and the RCLK frequency $F_{RCLK}$ according to the following Equation (1):

$$F_{DCLK} = \frac{SF}{MODULO} \times F_{RCLK} \quad (1)$$

where SF is the n-bit scaling factor that linearly determines the output frequency of the DTO. Typically, the RCLK frequency and the MODULO are fixed, and the desired DTO output frequency is dynamically controlled by the value of SF. The value of MODULO usually equals $2^n$, where n is number of DTO adder bits.

The staircase DTO output signal has to be converted to DCLK signal by some output module. Thus, the first function of the output module is to create rectangular waveform of DCLK. The second function is to reduce the jitter of the DTO output period to be equal to $T_{RCLK}$. A known example of an output module is illustrated by way of the block diagram in FIG. 3. In the diagram, an n-bit value SF sets the frequency of the n-bit DTO signal $F_{DTO}$, which is fed into a form module 307 of an output module 305 for signal conditioning. Form module 307 generates an arbitrary wave form with the same period as $F_{DTO}$ by taking the output of DTO 304 as a memory address for lookup table (LUT) 308 which inputs the appropriate values from each corresponding LUT address location into digital-to-analog converter (DAC) 310, which thereby generates the desired waveform that is smoothed by low-pass filter 312. The LUT and filter are usually included to reduce harmonic frequency distortion in the DTO frequency by blocking the highest harmonic frequencies and permitting principally the main clock frequency to pass through, thereby also reducing, but not eliminating, phase jitter. Schmidt trigger 314 converts the analog representation of $F_{DTO}$ into a binary frequency DTO_CLK that is fed into PLL 316 for frequency conversion. Alternatively, DTO_CLK may be used as the DCLK output without PLL 316 in some applications. Another useful component in the frequency conversion of discrete signals is a direct digital synthesizer (DDS), shown by way of example in FIG. 4a. The DDS usually performs a frequency step-down function. Summation unit 402 adds the n-bit value SF stored in SF register 404 to the n-bit value from the output of phase accumulator 406. The sum is synchronously updated upon each rising edge of SCLK. Phase accumulator 406 feeds the n-bit DDS frequency $F_{DDS}$ to the output module, and feeds back $F_{DDS}$ to summation unit 402, thereby generating, over some number of SCLK cycles, a staircase periodic signal 408 with a frequency given by the formula in Equation (2) below:

$$F_{DDS} = \frac{SF}{2^n} F_{SCLK} \quad (2)$$

where $F_{SCLK}$ is the frequency value of SCLK. Output module 410 converts the DDS frequency signal $F_{DDS}$ to a destination clock DCLK. Output module 410 could, for example, convert the staircase waveform into a binary clock signal with frequency $F_{DDS}$. It should be noted that the jitter in the period of staircase periodic signal 408 is equal to the SCLK period. If the SCLK period varies over a wide range (i.e., has high jitter), then it may be difficult (or impossible) to design the output module to reduce the jitter effectively.

Another kind of relevant DDS frequency converter 450 is illustrated by way of example in FIG. 4b. Source divider 452 divides SCLK by an integer value SDIV to create reference signal REF. Destination divider 464 divides DCLK by and integer value DDIV generate a Feedback signal. Phase detector 454 compares the positions of the REF and Feedback signals to each compare period where the compare period is the time between two consequent REF signals. The Freq_set output values of the phase detector are generally proportional to the difference between compare period and feedback period. Frequency value generator 456 accumulates the Freq_set values from phase detector 454 and creates the output value Freq_val that is fed as an input to DTO 457. DTO 457 consists of adder 458 and register 460. The DTO output is then conditioned by output module 462 to produce the DCLK frequency.

Important areas where frequency converters are often used include computer CRT and LCD monitors. In such devices, the output clock period $T_{DCLK}$ and input clock period $T_{SCLK}$ follow the Equation (3) below:

$$Sh_{TOTAL} \times Sv_{TOTAL} \times T_{SCLK} = Dh_{TOTAL} \times Dv_{TOTAL} \times T_{DCLK} \quad (3)$$

Where
$Sh_{TOTAL}$ is the number of SCLK periods in the source line;
$Sv_{TOTAL}$ is the number of lines in the source frame;
$Dh_{TOTAL}$ is the number of DCLK periods in the destination line;
$Dv_{TOTAL}$ is the number of lines in the destination frame;
$T_{SCLK}$ is the duration of the source clock period; and
$T_{DCLK}$ is the duration of the destination clock period.

Frequency converters in devices where frame rate conversion is used, generally follow Equation (4) below:

$$m \times Sh_{TOTAL} \times Sv_{TOTAL} \times T_{SCLK} = n \times Dh_{TOTAL} \times Dv_{TOTAL} \times T_{DCLK} \quad (4)$$

Where m, n are integers.

The maximum value of SDIV required in frequency converter 450 is equal to $m \times Sh_{TOTAL} \times Sv_{TOTAL}$, and the compare period is m source frames. The SDIV and compare period can be reduced if values $m \times Sh_{TOTAL} \times Sv_{TOTAL}$ and $n \times Dh_{TOTAL} \times Dv_{TOTAL}$ have common denominator. In some cases, however, it is impossible to have large common denominator. If there is a step change in the SCLK period, $T_{SCLK}$, then the DCLK period, $T_{DCLK}$, in frequency converter 450 gradually will converge to a new stable state. The time it takes to converge (i.e., response time) depends on the compare period. The longer the compare period, the more time it will take frequency converter 450 to converge, which can be up to several frames. However, in many CRT/LCD monitor applications a long response time is not acceptable.

Phase detector 454 has to correctly resolve a wide range of situations. One such situation, for example, is when $T_{DCLK}$ is greater than two times more or less than $T_{SCLK}$. As can be appreciated, phase detector 454 performs both logical and calculation operations, and is, therefor, generally difficult to design.

Although frequency converters generally work well in many cases, there is a continual need for improved digital frequency converters designs. In particular, there is a general need for frequency converters that have a fast response time, and simple phase error detection mechanism. It would be desirable for these frequency converters to work well in CRT/LCD monitors applications as well.

SUMMARY OF THE INVENTION

To achieve the foregoing and other objects and in accordance with the purpose of the present invention, a method and apparatus for digital frequency conversion using only digital components is provided.

In one embodiment of the invention, a target phase accumulator unit generates a target phase signal to a phase detector unit. The target phase accumulator unit receives inputs from a reference signal input, and a target phase input value. The digital phase detector unit is configured to receive the reference signal, a current phase feedback input signal, and the target phase input signal. The phase detector unit outputs a first frequency setting signal to a frequency value generator unit. The frequency value generator unit is configured to output a frequency value signal to a digital oscillator unit that generates a corresponding digital output signal that is directly fed back to the current phase feedback input of the phase detector unit. In some embodiments, the current phase feedback signal includes both integer and fractional phase information. In other embodiments only fractional phase information may be required.

In some cases, the target phase accumulator unit may include a phase correction input value that is used to generate the appropriate target phase signal. In yet other cases, the target phase accumulator unit may use a second reference signal that does not have the same phase as the first reference signal input used by the phase detector unit. Further, the target phase accumulator unit may be configured in some applications with a multiplexer unit that uses the second reference signal as a control signal to select one of two input values for subsequent calculations by the target phase accumulator unit. For example, the multiplexer can be used to select either the target phase input value or alternatively use information derived from a phase correction input value to use in generating the target phase signal output.

In some embodiments the phase detector unit generates a first frequency setting signal that is proportional to the difference between the current phase feedback input signal and the target phase input signal. Moreover, in other embodiments the phase detector unit generates a second frequency setting signal that is proportional to the difference between the current phase feedback input signal and the target phase input signal.

The phase detector unit can control when to output the first frequency setting signal in some embodiments. In these embodiments, the phase detector unit includes a multiplexer that uses the first reference signal as a select line to choose when to output the first frequency setting signal to the frequency value generator.

The reference signals used in the present invention may be generated in a variety of suitable ways. In some embodiments, a source clock is fed into a frequency divider, which generates the required reference signals.

Furthermore, in some embodiments, the digital output signal from the digital oscillator is conditioned by an output module to generate an output signal suitable for the particular application.

One embodiment of a method to achieve frequency conversion in the foregoing apparatus embodiments is to determine a first compare period based on the first reference signal, and calculate a target phase value that is used to calculate a frequency setting parameter. The calculation is based on the difference between the current phase value and the target phase value, wherein the current phase value includes integer and fractional phase information. In some implementations, frequency setting parameter is proportional to the said difference. A frequency value that drives the digital oscillator at the corresponding output frequency is derived from frequency setting parameter, and is used to update the digital oscillator to oscillate at the updated frequency setting.

In some embodiments, the frequency value and frequency setting parameter are calculated during the first compare period. In other embodiments, calculating the target phase value occurs the during a second compare period that is based on the second reference signal. In some cases, the target phase value is calculated using a phase correction value.

A computing system and software product that implements the present invention is also provided.

Other features, advantages, and object of the present invention will become more apparent and be more readily understood from the following detailed description, which should be read in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE EMBODIMENTS

Figure 1:
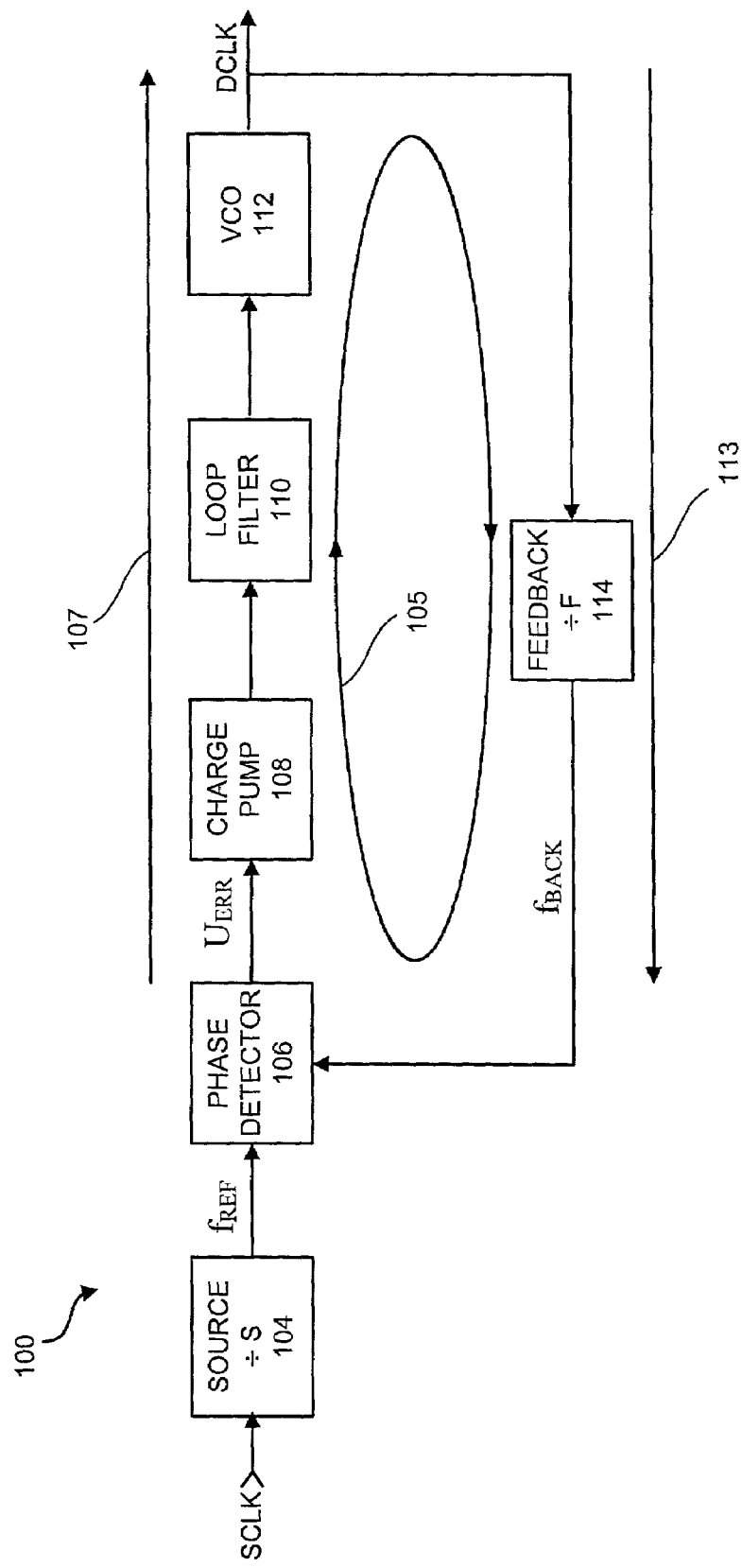
FIG. 1 illustrates an exemplary block diagram of a known phase locked loop (PLL) frequency converter.
Figure 2:
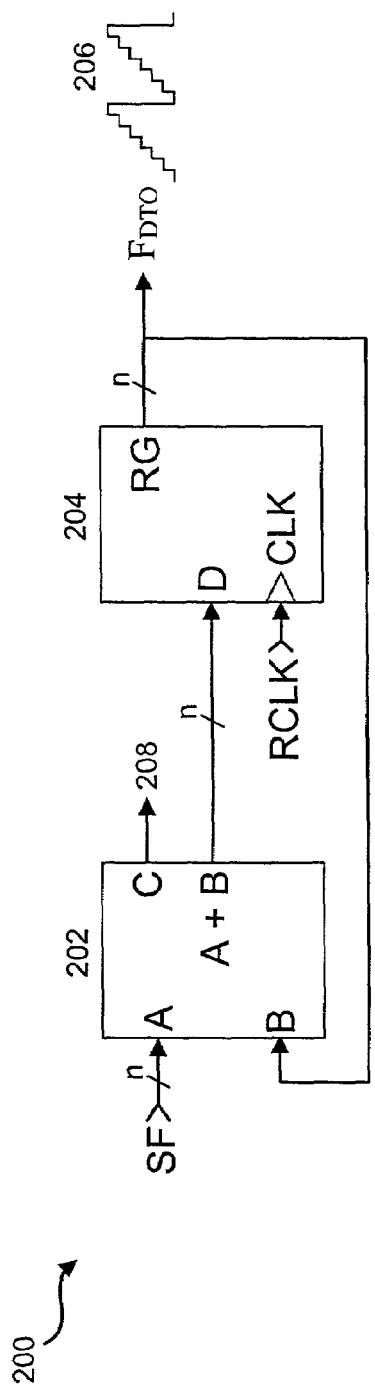
FIG. 2 is a diagram that illustrates an exemplary digital circuit implementation of a conventional discrete-time oscillator (DTO)

The present invention will now be described with reference to an embodiment thereof as illustrated in accompanying drawings. In the following description, specific details are set forth in order to provide a better understanding of present invention. It will be apparent, however, to one skilled in the art, that the present invention may be practiced without some or all of these specific details. In other instances, well-known steps and/or system components have not been described in detail in order to not unnecessarily obscure the present invention.

In view of the foregoing, and to achieve other objects of the invention, an all-digital frequency converter is provided that has fast response time and relatively simple design. The general direct digital synthesis (DDS) servo system according to an embodiment of the present invention is illustrated by way of the block diagram in FIG. 5. The DDS servo frequency conversion system shown in the figure is a frequency converter that converts the input source clock SCLK having a first frequency to an output destination clock DCLK at a second frequency.

Source divider 504 divides SCLK by an integer value SDIV to create a reference signal Ref. The Ref signal sets the compare period ($T_{CMP}$) that detector 502 uses as the time window to compare the other input signals and generate the detector's output signals. Other embodiments, however, may not have input source clock divider 504, and, instead, provides a suitable Ref signal by some other known approach. The Ref signal is fed into a phase accumulator 503 and a detector 502. A Phase_target input value to phase accumulator 503 is the constant for particular mode that determines the number of DCLK periods per compare period. For a given Phase_target input, phase accumulator 503 accumulates the phase of DCLK that has to be supported by servo system. The Target_val output of phase accumulator 503 is the ideal DCLK phase (i.e., target phase) that detector 502 compares the actual current phase Phase_current against during each compare period to determine the appropriate Phase_error and Freq_set control outputs. Phase_current is a feedback signal comprising integer and fractional phase information of the current DCLK output. Detector 502 outputs a Freq_set signal that is substantially proportional to the difference between ideal the DCLK phase set by Target_val and observed current DCLK phase indicated by Phase_current. A frequency value generator 506 accumulates the Freq_set values from detector 502 and creates the output value Freq_val that is the input of DTO 510. DTO 510 has fraction and integer outputs. Integer part accumulates the number of DTO periods that have occurred since the start of servo process. The fraction output of DTO 510 is the phase of the current DTO output period, exemplified as the staircase signal 512 that is fed into an output module 514. The combination of the integer and fraction outputs of DTO 510 is fed back as the signal Phase_current to indicate the actual phase of the current DTO output. Output module 514 appropriately conditions the DTO fraction output signal in known ways. For example, DCLK frequency can be conditioned as equal or proportional to the DTO frequency. In the simplest case, output module 514 maintains the DCLK frequency substantially equal to the DTO frequency.

Figure 6:
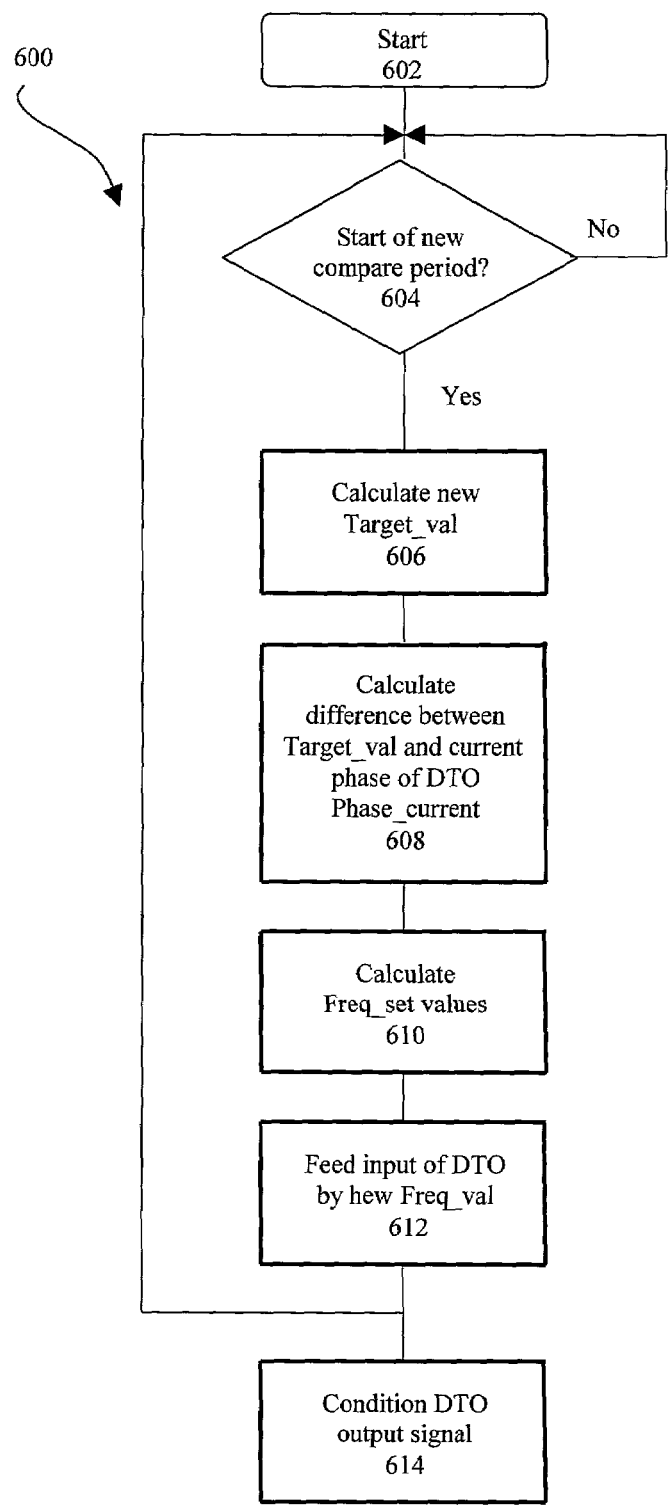
FIG. 6 illustrates a flow chart detailing the basic method to achieve digital frequency conversion according an embodiment of the present invention.

FIG. 6 illustrates a flow chart detailing a process 600 to achieve digital frequency conversion with having a relatively small response time according to an embodiment of the present invention. The process 600 begins at 602 by initializing various system parameters appropriately. For example, the output bits corresponding to the integer parts of DTO 510 and phase accumulator 503 are set to zero. Additionally, the registers in frequency value generator 506 are set to the state that corresponds to the desired DCLK frequency. User-defined constants, such as Phase_target and SDIV, for example, are also loaded at 602. At 604 the servo system waits at 604 until a new compare period begins. Upon the start of a new compare period, process 600 proceed forward to 606 where the phase accumulator calculates a new Target_val by adding Phase_target to the previous Target_val, thereby updating the ideal DTO output phase at the end of compare period. The difference is calculated, at 608 between Target_val and the real phase of DTO Phase_current. This difference is converted, at 610 to the proper Freq_set values, by multiplying, for example, the difference by constant coefficients. Alternatively, in other embodiments a right shift of the difference may be used instead of multiplying. The Freq_set values and current Freq_val are converted, at 612, to a new freq_val that feeds the input of DTO 519 during next compare period. By way of example, the new Freq_val may be the sum of the previous Freq_val and Freq_set values. Depending on the application, the DTO output signal is conditioned, at 614 into the appropriate signal for external system use. In some embodiments, step 614 is optional as the DTO output signal may be used directly by other system components. It should be appreciated that in several circumstances, the order of the various steps may be changed, some steps eliminated, and others added.

Figure 7:
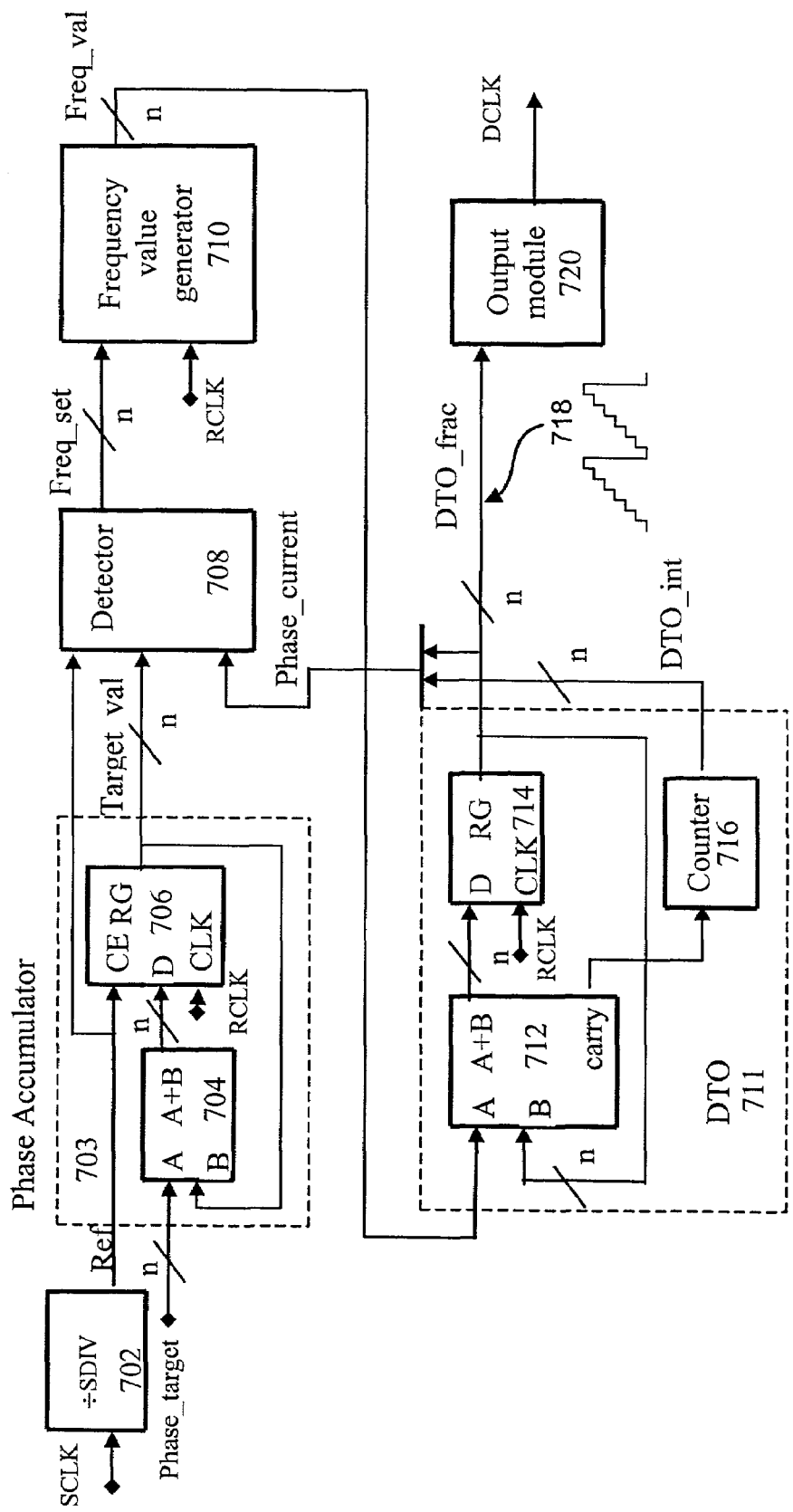
FIG. 7 illustrates a block diagram of an all-digital frequency conversion system implementing a DDS servo system according to another embodiment of the present invention.

Having described a general method to achieve digital frequency conversion in accordance with the present invention, a more detailed DDS servo system according to another embodiment of the present invention is illustrated by way of the block diagram in FIG. 7. The DDS servo frequency conversion system shown in the figure is the same as the DDS system shown in FIG. 5, except that some implementation details of the phase accumulator and DTO blocks are shown. These differences and other implementation details of the present invention will herein be discussed in the context of FIG. 7. Phase accumulator 703 comprises an adder 704 and a register 706. The Phase_target input value of phase accumulator 703, is the constant for a particular mode that determines the number of DCLK periods per compare period and includes the number of accumulated DCLK periods (i.e., the integer part) and the DCLK phase in the current period (i.e., the fractional part). The output value of adder 704 is synchronously fed into a register 706 by way of the Ref signal at the edge of a constant frequency reference clock, RCLK. That is, register 706 accumulates the phase of DCLK, including the integer and fraction parts of the phase that the servo system is to achieve. DTO 711 has fraction and integer parts DTO_frac and DTO_int, respectively. The integer part, DTO_int, is the total number of DTO periods that have occurred in the DTO output, as accumulated by counter 716. The fraction part, DTO_frac, of DTO 711 includes adder 702 and register 714 and it determines the phase of the current DTO output period. When a carry is generated by adder 712 at the end of a period, counter 716 increments by one, thereby generating the integer part of DTO 711. The output of register 714 is the staircase signal 718 (DTO_frac) that feeds the input of the output module 720. The signal Phase_current is formed by the concatenation of DTO_int and DTO_frac, and determines the real phase change in the DTO output signal from the start of the servo process. Output module 720 implements any desired signal conditioning operations on DTO_frac, and depends upon the particular application.

Implementation aspects of the present another embodiment will be presented in more detailed below. Beginning with the Phase_target control input, it is the target DCLK phase change per compare period $T_{CMP}$ that the servo system is to achieve. The value of Phase_target is determined by the ratio of $T_{CMP}$ and $T_{DCLK}$ as shown in Equation (5) below:

$$\text{Phase\_target}=T_{CMP}/T_{DCLK} \qquad (5)$$

Thus, to achieve a certain target DCLK frequency for frequency converter of the present embodiment, the system designer selects the appropriate SDIV value in the source clock divider 702, and inputs Phase_target as calculated above in Equation (5). The DTO output is initialized to be equal to the phase accumulator the part of full phase change at the start of servo process. It should be noted that the number of bits in the integer part of phase accumulator register 706 has to be enough for detector 708 to correctly resolve the difference between Target_val and Phase_current. Detector 708 compares Target_val and Phase current at the end of each compare period and calculates the corresponding Freq_set values to the feed-forward path of the DDS servo loop.

Unlike known phase control servo loops, there is no feedback divider in the feedback path, between the synthesized output signal 718 and the feedback input to detector 708, instead the present invention feeds back to detector 708 high-resolution information, Phase_current, instantaneously provided by DTO 711. The sampling resolution of the Phase_current signal is a small fraction of DCLK period, and is sufficient to calculate accurate cycle-by-cycle phase error values. There is a small deterministic error in the Phase_target signal that corresponds to the least significant bit of DTO 711. This rounding error determines the maximum frequency setting accuracy Phase_target. If the accuracy is sufficient for a particular application then no additional input is required in phase accumulator 703 for compensation. However, if the accuracy is insufficient, a Phase_correct input (not shown) to phase accumulator 703 may be provided to compensate for this resolution error. The correction is made one time per several compare periods, for example, after the end of frame or after the end of m frames accordingly to Equations (1) and (2).

To generate the control parameters for the feed-forward loop path, detector 703 determines the difference between the DTO output phase change and the ideal phase change set by phase accumulator, and calculates the Freq_set correction values required to bring the DTO output phase to be equal to ideal Target_val phase. As an example of a proportional servo system, Freq_set could be calculated by multiplying the phase difference by a constant.

The Freq_set control parameters are recalculated after each compare period, TCMP, set by Ref, and are held constant until the end of next compare period. It should be appreciated that a longer TCMP can increase the response time of the control loop. Because detector 708 receives instantaneous, high-resolution phase information from the Phase_current feedback signal, loop stability, however, is not significantly dependent on the duration of $T_{CMP}$, as the Freq_val is calculated immediately. Furthermore, it should be noted that the values of Phase_target and $T_{CMP}$ could be appropriately varied, as given by Equation (5), over wide range while maintaining the desired output frequency.

Figure 3:
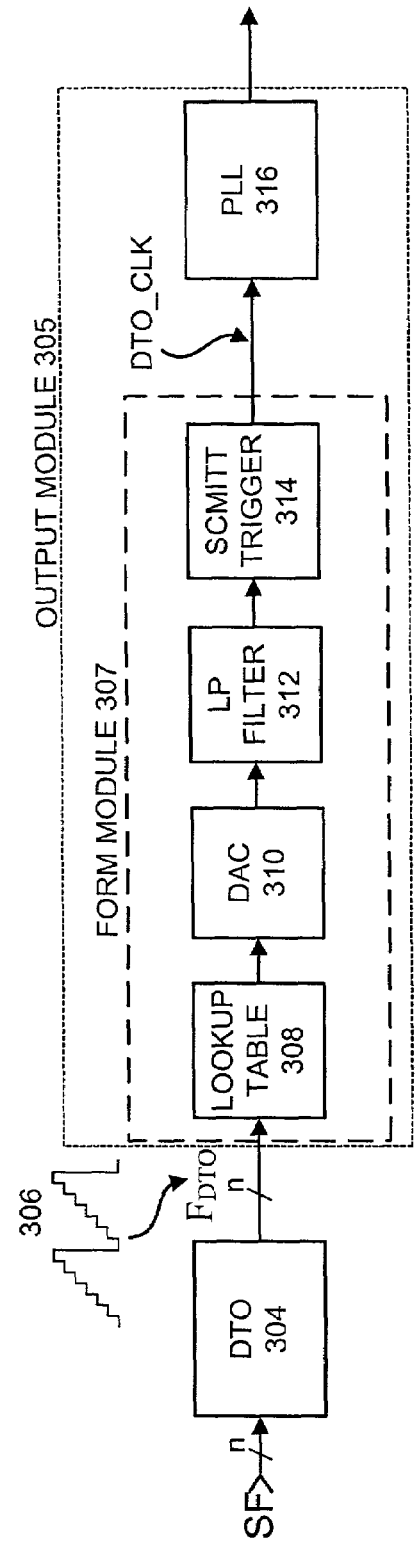
FIG. 3 illustrates an exemplary block diagram of a known DTO-based frequency converter.
Figure 4A:
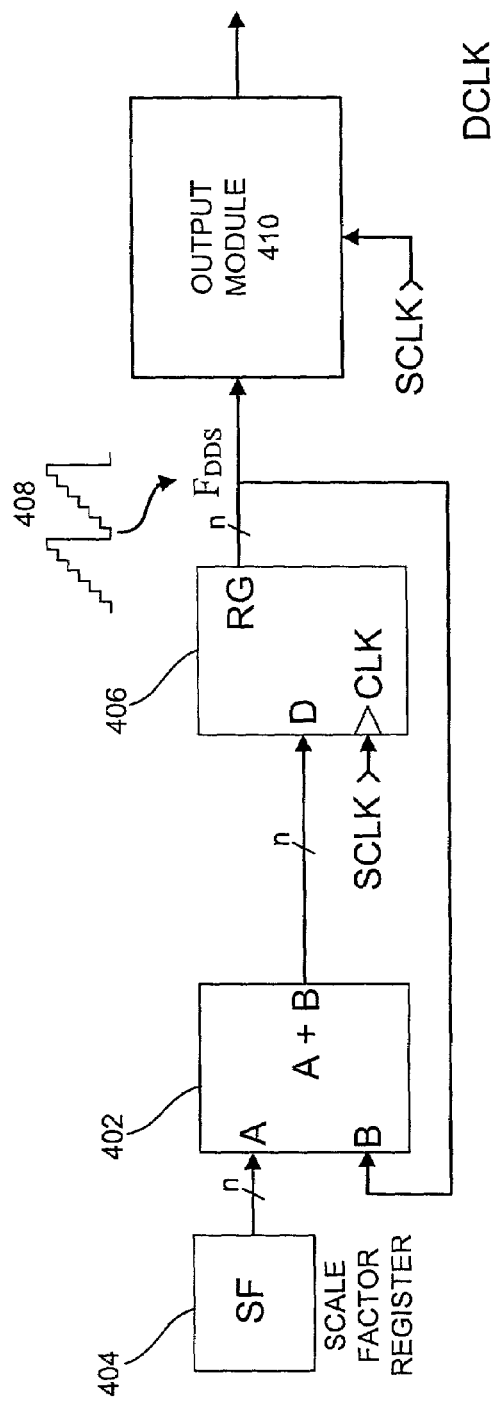
FIG. 4a is a diagram that illustrates an exemplary digital circuit implementation of a conventional direct digital synthesizer (DDS)
Figure 4B:
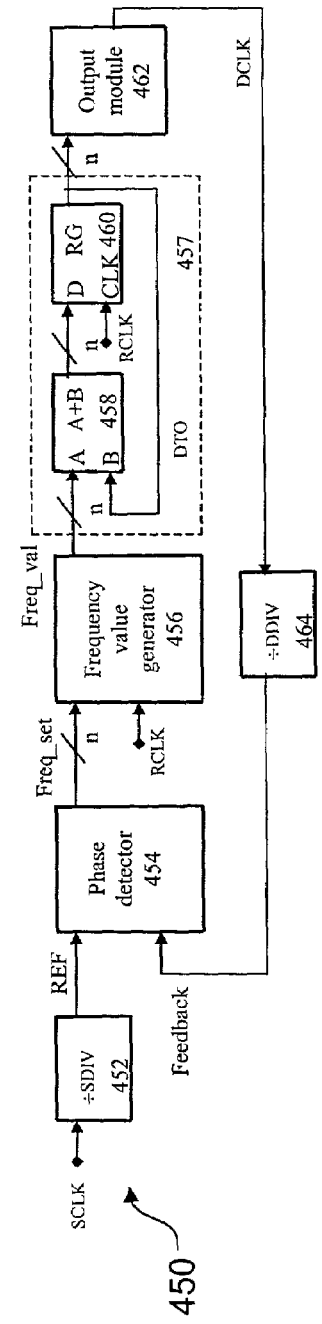
FIG. 4b is a diagram that illustrates an exemplary digital circuit implementation of another conventional direct digital synthesizer (DDS)

In the present embodiment, the feed forward path of the DDS servo loop comprises a frequency value generator 710 and DTO 711. Detector 708 outputs the Freq_set parameters to the frequency value generator 710, which calculates the value Freq_val required by DTO 711 to generate the desired output frequency of DCLK. Unlike known discrete-time oscillators, the DTO 711 includes an additional integer part beyond the usual fraction output signal DTO_frac, which feeds into the input of a known output module 720 for signal conditioning. By way of example, to convert output signal DTO_frac to a binary clock signal, output module 720 could have a lookup table and digital-to-analog converter (DAC) as an input stage, and a Schmitt triggered low pass filter as an output stage as shown in FIG. 3. The integer part of DTO 711, DTO_int, taken together with fractional part, DTO_frac, represents the current phase, Phase_current, of the DTO, and represents the full phase change of the DTO output signal from the start of the servo process. The number of bits in the integer part of DTO 711 has to be enough to determine correctly the difference between Target_val and Phase_current.

Figure 5:
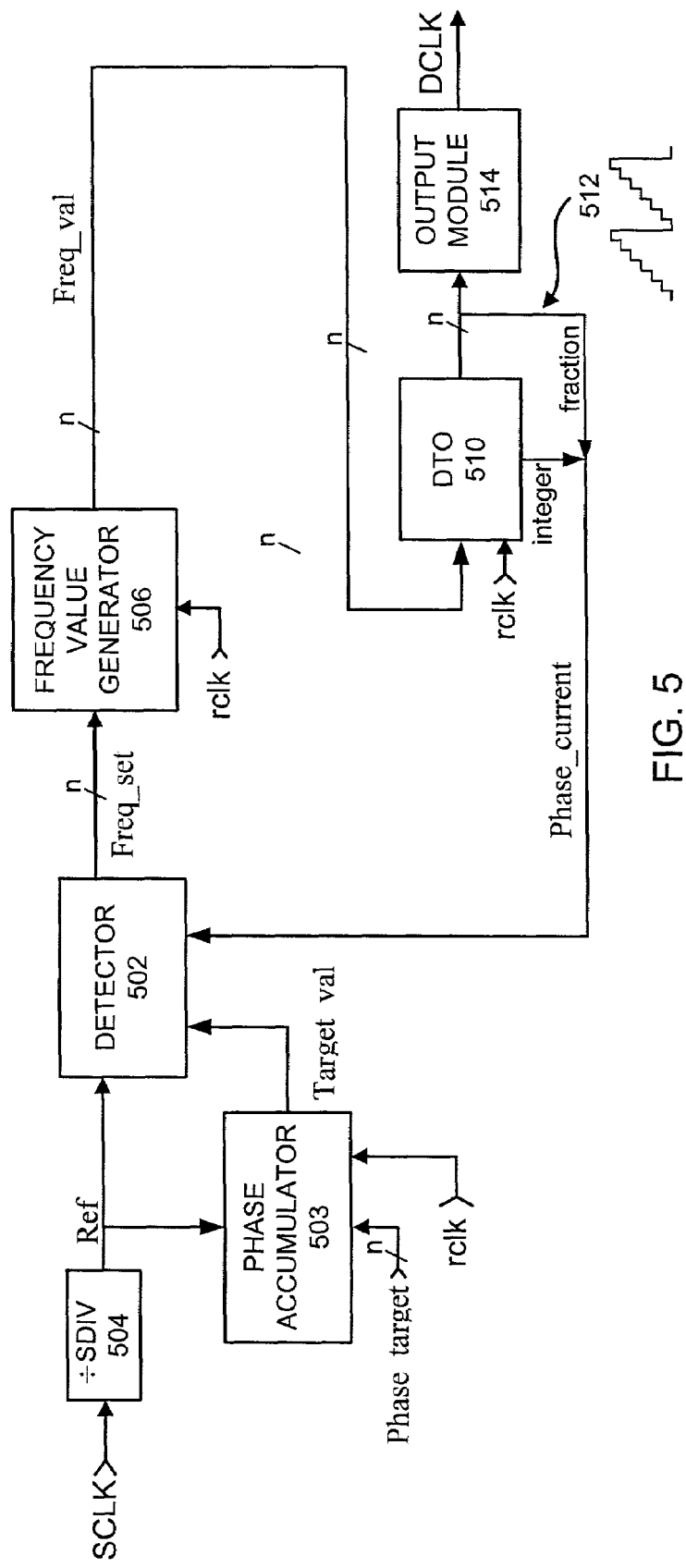
FIG. 5 illustrates a block diagram of an all-digital frequency conversion system implementing a DDS servo system according to an embodiment of the present invention.
Figure 8:
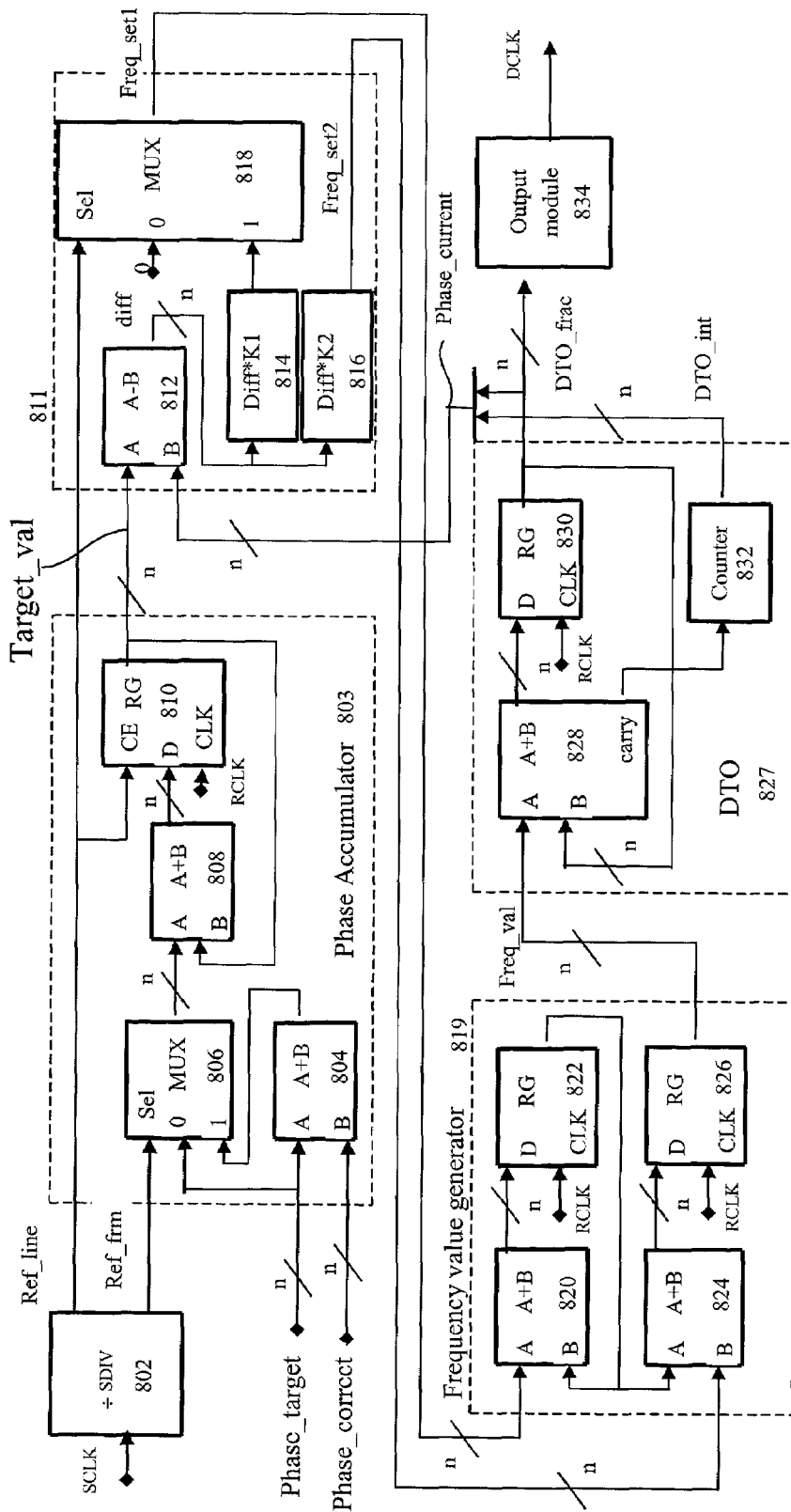
FIG. 8 illustrates a block diagram of an all-digital frequency conversion system implementing a DDS servo system according to another embodiment of the present invention.

It should be appreciated that the various DDS servo system blocks shown in FIG. 5 can be realized in many different ways that best suit the particular application. An embodiment that is directed towards frequency conversion in the computer display monitors is illustrated in FIG. 8. This embodiment is the same as previous embodiment, except some system blocks have been implemented with particular hardware components and there are additional inputs to the phase accumulator such as ref_frame and Phase_correct.

In this computer monitor embodiment of the present invention, a phase accumulator 803 receives two input reference signals: a Ref_line that is the same as REF in FIG. 6, and a Ref_frame that marks the end of the m frames, where m is integer. The phase accumulator includes an adder 804, multiplexer 806, adder 808, and a register 810. The new Target_val is stored in the register 810 at an edge of reference clock RCLK that occurs when Ref_line signal is active at the end of compare period, where RCLK has a constant frequency. The Ref_line signal is active during one RCLK period. If the Ref_frame signal is active then the sum of Phase_target and Phase_correct is present at the input of adder 808. In other compare periods Phase_target is passed to the input of adder 808 through multiplexer 806. Detector 811 contains a subtracter 812 that calculates the difference (diff) between Target_val and the feedback signal Phase_current. Two multipliers 814, and 816 are used in detector 811 to calculate the detector output values: Freq_set1 and Freq_set2. Coefficients K1 and K2 are constants for the current mode. Simple right shifters may be used instead of multipliers in other embodiments. These coefficients, for example, can be adjusted to determine the quality of servo system, and the speed of the transition process (i.e., system response time).

Multiplexer 818 passes the Freq_set1 value to the next block during an RCLK period occurring at the end of a compare period. A frequency value generator 819 includes an adder 820, register 822, adder 824, and an output register 826. During each compare period, the value in the register 822 is changed by value Freq_set1. In the servo system's stable state, the value in the register 822 is substantially equal to Freq_val at the input of DTO 827, which is required to achieve a DTO output frequency that corresponds to the Phase_target. Register 826 stores the sum, Freq_val, of the value in the register 822 and Freq_set2 from detector 811. It should be noted that both adder 824 and register 826 are optional. They are included to make the transition process fast and stable. Accordingly, they may be omitted in applications that do not require these features.

DTO 827 consists of an adder 828, register 830, and a counter 832. Adder 828 and register 830 represent the fractional part of the DTO output. The output of the register 830 is the staircase n-bit signal DTO_frac that is used as input to the output module 834. Counter 832 represents the integer part of the DTO output. It is incremented by carry signals from the adder 828. The concatenation of the counter 832 output and register 830 output forms Phase_current and is fed back to an input of detector 811. The Phase_current feedback signal represents the full phase change in the DTO output signal from the start of servo process.

It should be noted that the servo system in FIG. 8 can work correctly from any initial state but the duration of the transition process can be decreased significantly if during the first stage of transition process (when the difference between Target_val and Phase_current is high) the integer parts of Target_val in the register 810 and integer part of DTO in the counter 832 are set to zero after the start of each new compare period. As a result, the output of subtracter 812 represents the difference between ideal DTO phase change and real DTO phase change from the last compare period. Other approaches to calculating the phase difference will be apparent to those skilled in the art and are contemplated as within the scope of the present invention.

Some basic system parameters will be herein calculated by way of example. To simplify calculations it is preferable to select SDIV to be equal $Sh_{TOTAL}$; however, any suitable value will work. If SDIV is set to equal $Sh_{TOTAL}$ and the DCLK frequency is equal to the DTO output frequency, then Phase_target can be determined by Equation (6) below:

$$\text{Phase\_task} = \frac{T_{CMP}}{T_{DCLK}} = \frac{n \times Dh_{TOTAL} \times Dv_{TOTAL}}{m \times Sv_{TOTAL}} \quad (6)$$

Detector 811 in FIG. 8 calculates the appropriate values of Freq_set1 and Freq_set2 based on the difference between the Target_val and Phase_current values at the end of a compare period. The general formula for calculating Freq_set1 is given by Equation (7) below:

$$\text{Freq\_set1} = K1 \times dPh \quad (7)$$

where dPh is the difference between desired phase change and Phase current at the end of compare period, and K1 is a constant for particular mode of the servo system.

A similar formula for calculating Freq_set2 is given by Equation (8) below:

$$\text{Freq\_set2} = K2 \times dPh \quad (8)$$

Designers who are experienced in the art can readily determine the suitable values for coefficients K1, K2. However, for robust convergence to a stable state, K1 and K2 are preferably selected below a maximum value $K_{MAX}$ given by Equation (9) below:

$$K_{MAX} = \frac{T_{RCLK}}{T_{CMP}} \quad (9)$$

where $T_{RCLK}$ is the reference clock period, and $T_{CMP}$ is the duration of compare period—the time between two consecutive Ref_line signals in FIG. 8. The values of coefficients K1, K2 can be calculated as shown by the following Equations (10) and (11):

$$K_1 = \frac{n_1 \times T_{RCLK}}{T_{CMP}} \quad (10)$$

$$K_2 = \frac{n_2 \times T_{RCLK}}{T_{CMP}} \quad (11)$$

where $n_1<1$, $n_2<1$. It should be appreciated that the smaller coefficients n1, n2 are, the longer is the response time to jitter in source SCLK period.

An initial consideration in designing the present frequency converter is determining the application's acceptable phase error during a given compare period and destination frame. One deterministic factor effecting phase error in the present embodiment is the number of bits, n, in the fraction part of the DTO (i.e., adder 828 and register 830). The same number of bits is used in the fractional part of phase accumulator (i.e., register 810) and in the output of frequency value generator (Freq_val). It is preferable to have the same number of bits in the fractional part of Phase_target as are in the input of the phase accumulator.

Aspects related to DTO design will be discussed in more detail below. As described above, the integer part of the DTO output counts the number DTO periods, and the fraction part resolves the current phase of the DTO output with a discrete accuracy corresponding to the least significant bit of the DTO. Thus, a maximum phase error can be designed by appropriately selecting the number of DTO bits, n, which can be determined by Equation (12) below:

$$T_{DCLK} = \frac{MODULO \times T_{RCLK}}{Freq\_val} \quad (12)$$

where $1<\text{Freq\_val}<\text{MODULO}$, and $\text{MODULO}=2^n$.

If the least significant bit of Freq_val is changed then the error per DCLK period due to the change ($dT_{DCLK}$) is determined by Equation (13) below:

$$dT_{DCLK} = -\frac{2^n}{Freq\_val^2} \times T_{RCLK} \quad (13)$$

Assuming that $T_{CMP}$ is the duration of the compare period, $dT_{CMP}$ is the error of compare period that corresponds to $dT_{DCLK}$, and that $dN_{CMP}$ is the number of DCLK periods that corresponds to $dT_{CMP}$, then $dN_{CMP}$ is calculated as shown by Equation 14 below:

$$dN_{CMP}=dT_{CMP}/T_{DCLK}=[T_{CMP}/(T_{DCLK})^2]\times dT_{DCLK}=+T_{CMP}/T_{RCLK}\times 2^n \quad (14)$$

For example, if the compare period is 100*10**6 ps and $T_{RCLK}$ is 4000 ps then $dN_{CMP}=25000/2^n$.

Thus, if the number of DTO bits in the fraction part is n=20, this approximately translates to a 0.025 error in the DCLK period per compare period.

The ideal phase change in the DTO output (Ph_frm_ideal) during m source frames is determined in the phase accumulator as shown in Equation (15) below:

$$Ph\_frm\_ideal=\text{Phase\_target}\times m\times Sv_{TOTAL} \quad (15)$$

where Phase_target is determined by Equation (6).

If fraction part of Phase_target has n bit then the change of the least significant bit gives the error dPh_frm_ideal that is determined by Equation (16) below:

$$dPh\_task=(m\times Sv_{TOTAL})/2^n \quad (16)$$

By way of example, if the variables are chosen as follows: m=31, $Sv_{TOTAL}$=2000, and n=20, then dPh_task equals 0.06 of a DCLK period. The Phase_correct value in input of phase accumulator 803 is used to exclude the error due to the rounding of Phase_target.

Figure 9:
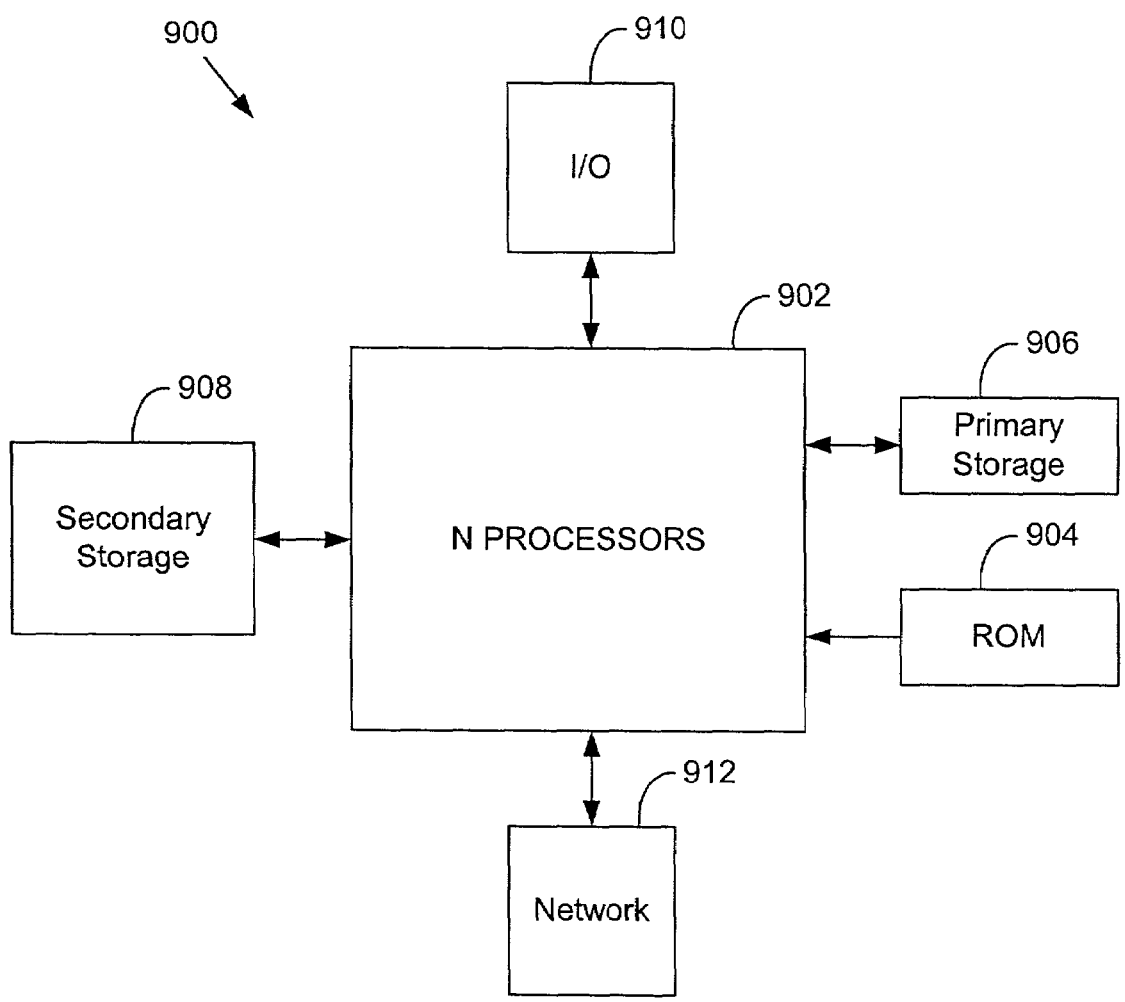
FIG. 9 is a diagrammatic representation of a general-purpose computer system suitable for implementing the present invention.

FIG. 9 illustrates a computer system 900 employed to implement the invention. As is well known in the art, ROM acts to transfer data and instructions uni-directionally to the CPUs 902, while RAM is used typically to transfer data and instructions in a bi-directional manner. CPUs 902 may generally include any number of processors. Both primary storage devices 904, 906 may include any suitable computer-readable media. A secondary storage medium 908, which is typically a mass memory device, is also coupled bi-directionally to CPUs 902 and provides additional data storage capacity. The mass memory device 908 is a computer-readable medium that may be used to store programs including computer code, data, and the like. Typically, mass memory device 908 is a storage medium such as a hard disk or a tape which generally slower than primary storage devices 904, 906. Mass memory storage device 908 may take the form of a magnetic or paper tape reader or some other well-known device. It will be appreciated that the information retained within the mass memory device 908, may, in appropriate cases, be incorporated in standard fashion as part of RAM 906 as virtual memory. A specific primary storage device 904 such as a CD-ROM may also pass data uni-directionally to the CPUs 902.

CPUs 902 are also coupled to one or more input/output devices 910 that may include, but are not limited to, devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPUs 902 optionally may be coupled to a computer or telecommunications network, e.g., an Internet network or an intranet network, using a network connection as shown generally at 912. With such a network connection, it is contemplated that the CPUs 902 might receive information from the network, or might output information to the network in the course of performing the above-described method steps. Such information, which is often represented as a sequence of instructions to be executed using CPUs 902, may be received from and outputted to the network, for example, in the form of a computer data signal embodied in a carrier wave. The above-described devices and materials will be familiar to those of skill in the computer hardware and software arts.

Although only a few embodiments of the present invention have been described in detail, it should be understood that the present invention may be embodied in many specific forms without departing from the spirit or scope of the invention. Particularly, the servo system may have other input parameters that do not substantially change the described servo looping mechanism. Moreover, some inputs shown in the illustrated embodiments, such as Phase_correct, may not be included by some embodiments of the present invention, while not substantially changing the described servo looping mechanism. Similarly, other embodiments may have a multiplicity of Ref inputs as inputs to the phase accumulator. Additionally, in some embodiments the Phase_current feedback information is split into more than one input, possibly due to separate integer and fraction counting units, whereby the servo system is configured to accept and use this split feedback information as described in the illustrated embodiments. Moreover, although the illustrated embodiments were shown to have frequency value generator unit separate from detector, it is contemplated as within the scope of the present invention that the detector could directly output the appropriate DTO frequency value into the input of the DTO. Therefore, the present examples are to be considered as illustrative and not restrictive, and the invention is not be limited to the details given herein, but may be modified within the scope of appended claims.

I claim:

1. An apparatus for digital frequency conversion, the apparatus comprising:
   a digital phase detector unit configured to output a first frequency setting signal based on a multiplicity of input signals, the multiplicity of input signals including at least a first reference signal having a first frequency, a current phase feedback signal, and a target phase signal;
   a digital target phase accumulator unit coupled to the phase detector unit, wherein the target phase accumulator unit is configured to output the target phase signal based on a multiplicity of input signals including a second reference signal input, and a target phase input value;
   a digital frequency value generator unit coupled to the phase detector unit, wherein the digital frequency value is configured to receive the first frequency setting signal and output a frequency value signal; and
   a digital oscillator unit coupled to the frequency value generator unit, wherein the oscillator unit is configured to receive the frequency value signal, the digital oscillator unit being further configured to have a digital output signal at a second frequency that is directly fed back to the current phase feedback input of the phase detector unit, wherein the multiplicity of input signals to the target phase accumulator unit further includes a phase correction input value.

2. The apparatus of claim 1 further comprising:
   an output module coupled to the oscillator unit, wherein the output module is configured to receive the digital output signal of the oscillator unit, the output module being further configured to modify the digital output signal and output a modified output signal.

3. The apparatus of claim 1 wherein the current phase feedback signal comprises both integer and fractional phase information of the digital output signal.

4. The apparatus of claim 1 wherein the first frequency setting signal is proportional to the difference between the current phase feedback input signal and the target phase input signal.

5. The apparatus of claim 1 wherein the phase detector unit is further configured to have a second frequency setting signal that is proportional to the difference between the current phase feedback input signal and the target phase input signal.

6. The apparatus of claim 1 wherein the phase detector unit further comprises a multiplexer unit that is configured to receive the first reference signal as a control signal and the first frequency setting signal as a first input, the multiplexer unit being further configured with an output that outputs the first input based on the state of the control signal, wherein the multiplexer output is used by the frequency value generator unit for further calculation.

7. The apparatus of claim 1 wherein the first reference signal is generated by a frequency divider unit receiving an input signal having a third frequency.

8. The apparatus of claim 1 wherein the second reference signal input to the target phase accumulator unit does not have the same phase as the first reference signal input to phase detector unit.

9. The apparatus of claim 1 wherein the target phase accumulator unit further comprises a multiplexer unit that is configured to receive the second reference signal as a control signal, the target phase input value as a first input, and information derived from a phase correction input value as a second input, the multiplexer unit being further configured to select one of the first and second inputs based on the state of the control signal, wherein the selected input signal is used by the target phase accumulator unit for further calculation.

10. In an all-digital frequency conversion device, a method of frequency conversion, the method comprising the steps of:
    determining a first compare period, wherein the first compare period is based on a first reference signal having a first frequency;
    calculating a target phase value using a phase correction value;
    calculating a first frequency setting parameter based on the difference between a current phase value and the target phase value, wherein the current phase value includes integer and fractional phase information;
    calculating a frequency value suitable to be used by a digital oscillator to produce an output signal having a corresponding second frequency, wherein calculating the frequency value uses the first frequency setting parameter; and
    updating the digital oscillator with the frequency value.

11. The computer program product as recited in claim 10 wherein the calculating a target phase value using a phase correction value and calculating a first frequency setting parameter occur during the first compare period.

12. The method as recited in claim 10 wherein calculating the target phase value in (g) occurs at the during a second compare period, wherein the second compare period is based on a second reference signal.

13. The method as recited in claim 10 further comprising the step of calculating a second frequency setting parameter that is proportional to the difference between the current phase value and the target phase value.

14. An apparatus for digital frequency conversion, the apparatus comprising:
    a digital phase detector unit configured to output a first frequency setting signal based on a multiplicity of input signals, the multiplicity of input signals including at least a first reference signal having a first frequency, a current phase feedback signal, and a target phase signal wherein the digital phase detector unit comprises a multiplexer unit that is configured to receive the first reference signal as a control signal and the first frequency setting signal as a first input, the muiltiplexer unit being further configured with an output that outputs the first input based on the state of the control signal, wherein the multiplexer output is used by the frequency value generator unit for further calculation;
    a digital target phase accumulator unit coupled to the phase detector unit, wherein the target phase accumulator unit is configured to output the target phase signal based on a multiplicity of input signals including a second reference signal input and a target phase input value;

a digital frequency value generator unit coupled to the phase detector unit, wherein the digital frequency value generator unit is configured to receive the first frequency setting signal and output a frequency value signal; and a digital oscillator unit coupled to the frequency value generator unit, wherein the oscillator unit is configured to receive the frequency value signal, the digital oscillator unit being further configured to have a digital output signal at a second frequency that comprises both integer and fractional phase information of the digital output signal that is directly fed back to the current phase feedback input of the phase detector unit.

15. The apparatus of claim 14 wherein the first frequency setting signal is proportional to the difference between the current phase feedback input signal and the target phase input signal.

16. The apparatus of claim 14 wherein the phase detector unit is further configured to have a second frequency setting signal that is proportional to the difference between the current phase feedback input signal and the target phase input signal.

17. The apparatus of claim 14 wherein the first reference signal is generated by a frequency divider unit receiving an input signal having a third frequency.

18. The apparatus of claim 14 wherein the multiplicity of input signals to the target phase accumulator unit further includes a phase correction input value.

19. The apparatus of claim 14 wherein the second reference signal input to the target phase accumulator unit does not have the same phase as the first reference signal input to phase detector unit.

20. The apparatus of claim 14 wherein the target phase accumulator unit further comprises a multiplexer unit that is configured to receive the second reference signal as a control signal, the target phase input value as a first input and information derived from a phase correction input value as a second input, the multiplexer unit being further configured to select one of the first and second inputs based on the state of the control signal, wherein the selected input signal is used by the target phase accumulator unit for further calculation.

21. Computer program product executable by a processor for frequency conversion, comprising:

computer code for determining a first compare period, wherein the first compare period is based on a first reference signal having a first frequency;

computer code for calculating a target phase value using a phase correction value;

computer code for calculating a first frequency setting parameter based on the difference between a current phase value and the target phase value, wherein the current phase value includes integer and fractional phase information;

computer code for calculating a frequency value suitable to be used by a digital oscillator to produce an output signal having a corresponding second frequency, wherein calculating the frequency value uses the first frequency setting parameter;

computer code for updating the digital oscillator with the frequency value; and computer readable medium for storing the computer code.

22. Computer program product as recited in claim 21 wherein the calculating a target phase value using a phase correction value and calculating a first frequency setting parameter occur during the first compare period.

23. Computer program product as recited in claim 21 wherein calculating the target phase value occurs at the during a second compare period, wherein the second compare period is based on a second reference signal.

24. Computer program product as recited in claim 21 further comprising the step of calculating a second frequency setting parameter that is proportional to the difference between the current phase value and the target phase value.

* * * * *

UNITED STATES PATENT AND TRADEMARK OFFICE
CERTIFICATE OF CORRECTION

| | | |
|---|---|---|
| PATENT NO. | : 7,124,153 B2 | Page 1 of 1 |
| APPLICATION NO. | : 10/100803 | |
| DATED | : October 17, 2006 | |
| INVENTOR(S) | : Stanislav Grushin | |

It is certified that error appears in the above-identified patent and that said Letters Patent is hereby corrected as shown below:

Column 1, line 4, before "Field of Invention", insert the following paragraph:

--CROSS REFERENCE TO RELATED APPLICATIONS
This application is also related to the following co-pending U.S. Patent Application No. 10/101,305 (Attorney Docket No.: GENSP004), entitled "METHOD AND APPARATUS FOR DIGITAL FREQUENCY CONVERSION" naming Stanislav Grushin as inventor filed March 18, 2002 which is incorporated by reference in its entirety.--

Signed and Sealed this

Thirty-first Day of July, 2007

JON W. DUDAS
*Director of the United States Patent and Trademark Office*